(12) United States Patent
Thirunavukarasu et al.

(10) Patent No.: US 10,153,187 B2
(45) Date of Patent: Dec. 11, 2018

(54) METHODS AND APPARATUS FOR TRANSFERRING A SUBSTRATE

(71) Applicant: APPLIED MATERIALS, INC., Santa Clara, CA (US)

(72) Inventors: Sriskantharajah Thirunavukarasu, Singapore (SG); Eng Sheng Peh, Singapore (SG); Srinivas D. Nemani, Sunnyvale, CA (US); Arvind Sundarrajan, Singapore (SG); Avinash Avula, Sacramento, CA (US); Ellie Y. Yieh, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 328 days.

(21) Appl. No.: 14/933,628

(22) Filed: Nov. 5, 2015

(65) Prior Publication Data
US 2016/0133490 A1 May 12, 2016

Related U.S. Application Data

(60) Provisional application No. 62/078,397, filed on Nov. 11, 2014.

(51) Int. Cl.
*H01L 21/673* (2006.01)
*H01L 21/67* (2006.01)

(52) U.S. Cl.
CPC .. *H01L 21/67373* (2013.01); *H01L 21/67201* (2013.01); *H01L 21/67369* (2013.01); *H01L 21/67376* (2013.01); *H01L 21/67379* (2013.01)

(58) Field of Classification Search
CPC ......... H01L 21/67778; H01L 21/67389; H01L 21/67373; H01L 21/67376; H01L 21/67766
See application file for complete search history.

(56) References Cited

U.S. PATENT DOCUMENTS 4,549,843 A 10/1985 Jagusch et al.
5,474,177 A * 12/1995 Abrams ................ B65D 25/10
206/454

(Continued)

FOREIGN PATENT DOCUMENTS

JP H07-326656 A 12/1995
WO WO-2016094398 A1 * 6/2016 ........... H01L 21/673

OTHER PUBLICATIONS

Search Report and Written Opinion dated Feb. 15, 2016 received for PCT Application No. PCT/US2015/059747.

*Primary Examiner* — Kaitlin S Joerger
(74) *Attorney, Agent, or Firm* — Moser Taboada; Alan Taboada

(57) ABSTRACT

Embodiments method and apparatus for transferring a substrate are provided herein. In some embodiments, a substrate cassette includes a body having an upper portion and a lower portion, the upper portion and the lower portion defining an interior volume when the upper portion is coupled to the lower portion; a locking mechanism moveable between a locked position, in which the upper and lower portions are coupled, and an unlocked position, in which the lower portion can be separated from the upper portion; and a load distribution plate coupled to an upper surface of the upper portion along an edge of the upper portion to distribute a load applied to the load distribution plate.

19 Claims, 7 Drawing Sheets

(56) References Cited

U.S. PATENT DOCUMENTS

| | | | |
|---|---|---|---|
| 6,152,669 A | 11/2000 | Morita et al. | |
| 6,234,316 B1* | 5/2001 | Hsieh | H01L 21/67373 206/303 |
| 6,237,771 B1* | 5/2001 | Haq | H01L 21/67373 206/303 |
| 6,988,621 B2* | 1/2006 | Forsyth | H01L 21/67369 206/710 |
| 7,040,487 B2* | 5/2006 | Zabka | H01L 21/67353 206/454 |
| 7,431,162 B2* | 10/2008 | Forsyth | H01L 21/67353 206/710 |
| 7,469,788 B2* | 12/2008 | Chiu | G03F 1/66 206/710 |
| 7,528,936 B2* | 5/2009 | Gregerson | G03B 27/58 206/710 |
| 7,578,392 B2* | 8/2009 | Brooks | H01L 21/67353 206/521 |
| 7,607,543 B2* | 10/2009 | Gregerson | G03F 1/66 206/710 |
| 7,624,870 B2* | 12/2009 | Nishizaka | H01L 21/67353 206/303 |
| 7,918,341 B2* | 4/2011 | Pylant | H01L 21/67369 206/454 |
| 8,109,390 B2* | 2/2012 | Pylant | H01L 21/67379 206/303 |
| 8,813,964 B2* | 8/2014 | Pylant | H01L 21/67373 206/303 |
| 9,761,470 B2* | 9/2017 | Abe | H01L 21/6719 |
| 2002/0018703 A1 | 2/2002 | Kyouno | |
| 2006/0243612 A1* | 11/2006 | Nishizaka | H01L 21/67353 206/307 |
| 2008/0035514 A1* | 2/2008 | Chiu | H01L 21/67288 206/454 |
| 2010/0126904 A1* | 5/2010 | Cheng | H01L 21/67353 206/710 |
| 2011/0156735 A1 | 6/2011 | Breinlinger et al. | |
| 2012/9322915 | 12/2012 | Kim | |
| 2013/0248400 A1* | 9/2013 | Ku | H01L 21/67373 206/454 |
| 2014/0034548 A1* | 2/2014 | Pylant | H01L 21/67353 206/710 |
| 2015/0016926 A1* | 1/2015 | Oh | H01L 21/67389 414/217 |
| 2015/0266660 A1* | 9/2015 | Lystad | H01L 21/67359 206/454 |
| 2015/0318195 A1* | 11/2015 | Ohnuki | H01L 21/67373 206/710 |
| 2015/0325462 A1* | 11/2015 | Abe | H01L 21/6719 206/710 |
| 2016/0133490 A1* | 5/2016 | Thirunavukarasu | H01L 21/67201 414/805 |
| 2016/0133491 A1* | 5/2016 | Thirunavukarasu | H01L 21/67363 414/805 |
| 2016/0133494 A1* | 5/2016 | Thirunavukarasu | H01L 21/67778 414/217 |
| 2017/0186637 A1* | 6/2017 | Cho | H01L 21/67376 |

* cited by examiner

METHODS AND APPARATUS FOR TRANSFERRING A SUBSTRATE

CROSS-REFERENCE TO RELATED APPLICATIONS

This application claims benefit of U.S. provisional patent application Ser. No. 62/078,397, filed Nov. 11, 2014, which is herein incorporated by reference in its entirety.

FIELD

Embodiments of the present disclosure generally relate to substrate processing equipment, and more specifically, methods and apparatus for handling a substrate.

BACKGROUND

During processing of a substrate in for example, microelectronic device fabrication, the substrate may be transferred to multiple chambers to perform various processes. The substrate is in a vacuum during processing and at atmospheric pressure during transfer. Oxidation forms on the substrates upon leaving the vacuum environment and returning to atmospheric pressure. As such, the substrate undergoes a degas and/or preclean procedure to remove any oxidation prior to any further processing, resulting in processing delays.

Therefore, the inventors have provided improved methods and apparatus for substrate transfer.

SUMMARY

Embodiments of methods and apparatus for transferring a substrate are provided herein. In some embodiments, a substrate cassette includes a body having an upper portion and a lower portion, the upper portion and the lower portion defining an interior volume when the upper portion is coupled to the lower portion; a locking mechanism moveable between a locked position, in which the upper and lower portions are coupled, and an unlocked position, in which the lower portion can be separated from the upper portion; and a load distribution plate coupled to an upper surface of the upper portion along an edge of the upper portion to distribute a load applied to the load distribution plate.

In some embodiments, a substrate cassette includes a body having an upper portion and a lower portion, the upper portion and the lower portion having a plurality of slots and defining an interior volume when the upper portion is coupled to the lower portion, wherein the upper portion includes a plurality of tabs disposed on an upper surface of the upper portion, and wherein each of the plurality of slots has an elongated portion and a hole at an end of the elongated portion; a locking plate having a plurality of arms moveable between a locked position, in which the upper and lower portions are coupled, and an unlocked position, in which the lower portion can be separated from the upper portion; a plurality of locking pins, each of which is coupled to an end of a corresponding one of the plurality of arms; a plurality of protrusions, each of which extends from a corresponding one of the plurality of arms; and a load distribution plate coupled to an upper surface of the upper portion along an edge of the upper portion to distribute a load applied to the load distribution plate, wherein each of the plurality of locking pins extends through the elongated portion in the locked position, wherein each of the plurality of locking pins extend through the hole in the unlocked position, and wherein each of the plurality of protrusions extends beneath a corresponding one of the plurality of tabs.

In some embodiments, a method of loading a substrate to be processed into a substrate cassette includes evacuating a volume around the substrate cassette; unlocking a locking mechanism to uncouple an upper portion from a lower portion of the substrate cassette; separating the upper portion from the lower portion; placing the substrate on an inner surface of the lower portion; forcing the upper portion against the lower portion; and locking the locking mechanism to couple the upper portion to the lower portion.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
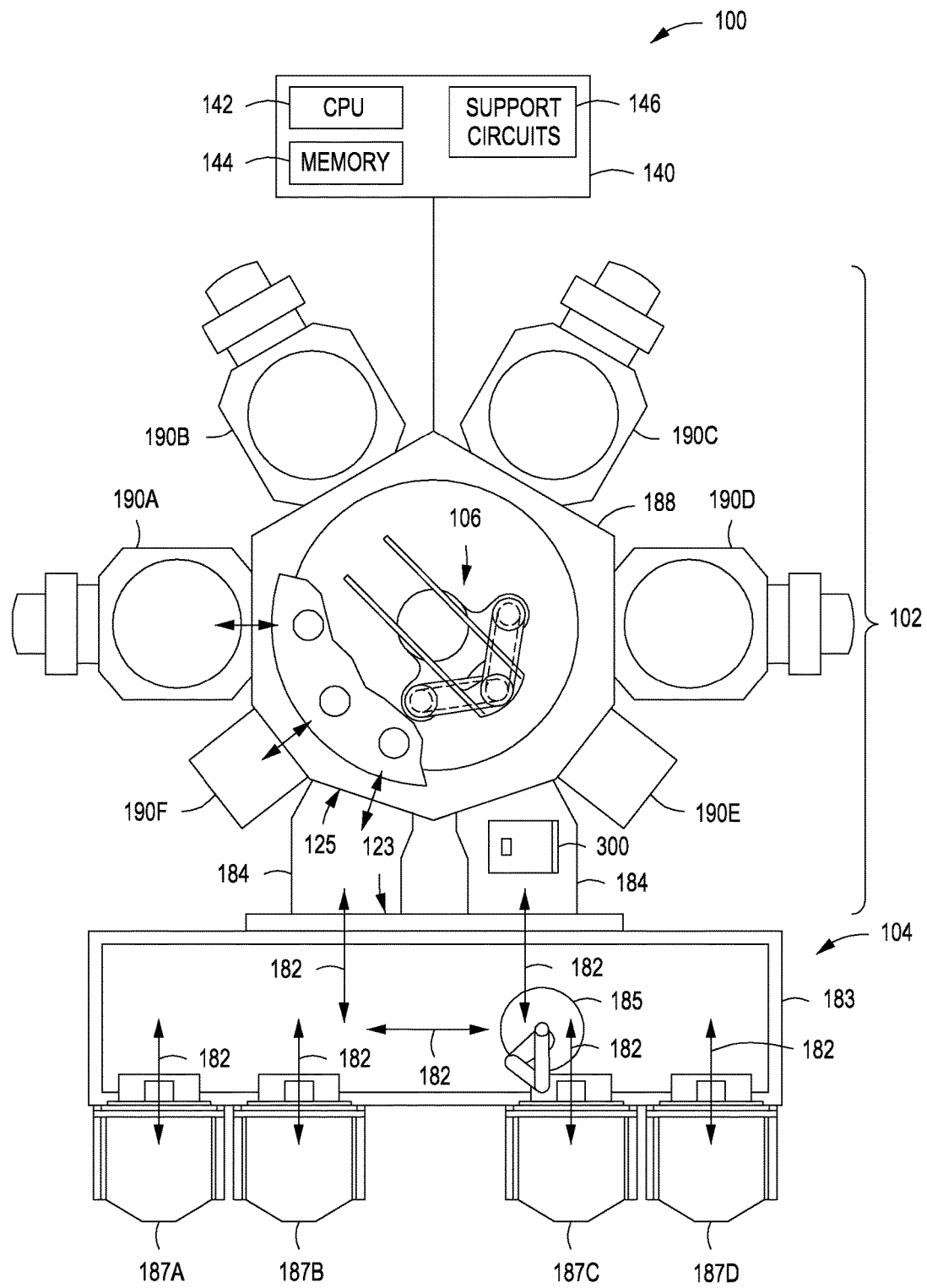
FIG. 1 depicts a schematic view of a processing system having a substrate transfer apparatus in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure generally relate to methods and apparatus for transferring a substrate. Embodiments of the inventive apparatus may include a substrate transfer chamber that advantageously mounts directly to a load lock chamber of a substrate processing tool, thus minimizing any negative impact on the floor space occupied by the substrate processing tool and avoiding unnecessary and costly modification of existing processing systems. The inventive substrate cassette of the present disclosure advantageously allows for the transport of a substrate in a vacuum, thus avoiding any oxidation that may occur on the substrate when moving from a vacuum environment to atmosphere.

FIG. 1 is a schematic top-view diagram of an exemplary multi-chamber processing system 100 that may be suitable for use with the present inventive apparatus disclosed herein. Examples of suitable multi-chamber processing systems that may be suitably modified in accordance with the teachings provided herein include the ENDURA®, CENTURA®, and PRODUCER® processing systems or other suitable processing systems commercially available from Applied Materials, Inc., located in Santa Clara, Calif. Other processing systems (including those from other manufacturers) may be adapted to benefit from the present disclosure.

In some embodiments, the multi-chamber processing system 100 may generally comprise a vacuum-tight processing platform (processing platform 102), a factory interface 104, and a controller 140. The processing platform 102 may include a plurality of process chambers 190A-F and at least one load lock chamber 184 (two shown) that are coupled to a transfer chamber 188. A substrate transfer robot 106 (described below with respect to FIGS. 2 and 3) is centrally disposed in the transfer chamber 188 to transfer substrates between the load lock chambers 184 and the process chambers 190A-F. The process chambers 190A-F may be configured to perform various functions including layer deposition including atomic layer deposition (ALD), chemical vapor deposition (CVD), physical vapor deposition (PVD), etch, pre-clean, de-gas, orientation and center-finding, annealing, and other substrate processes Each of the process chambers 190A-F may include a slit valve or other selectively sealable opening to selectively fluidly couple the respective inner volumes of the process chambers 190A-F to the inner volume of the transfer chamber 188. Similarly, each load lock chamber 184 may include a port to selectively fluidly couple the respective inner volumes of the load lock chambers 184 to the inner volume of the transfer chamber 188.

The factory interface 104 is coupled to the transfer chamber 188 via the load lock chambers 184. In some embodiments, each of the load lock chambers 184 may include a first port 123 coupled to the factory interface 104 and a second port 125 coupled to the transfer chamber 188. The load lock chambers 184 may be coupled to a pressure control system which pumps down and vents the load lock chambers 184 to facilitate passing the substrate between the vacuum environment of the transfer chamber 188 and the substantially ambient (e.g., atmospheric) environment of the factory interface 104.

In some embodiments, the factory interface 104 comprises at least one docking station 183 and at least one factory interface robot 185 (one shown) to facilitate transfer of substrates from the factory interface 104 to the processing platform 102 for processing through the load lock chambers 184. The docking station 183 is configured to accept one or more (four shown) front opening unified pods (FOUPs) 187A-D. Optionally, one or more metrology stations (not shown) may be coupled to the factory interface 104 to facilitate measurement of the substrate from the FOUPs 187A-D. The factory interface robot 185 disposed in the factory interface 104 is capable of linear and rotational movement (arrows 182) to shuttle cassettes of substrates between the load lock chambers 184 and the one or more FOUPs 187A-D.

In some embodiments, the inventive substrate transfer chamber 200 is disposed on a load lock chamber 184 to facilitate transfer of a substrate to or from the processing platform 102 while keeping the substrate in a vacuum atmosphere at all times. The processing platform, and the substrate transfer chamber, may be configured to process and handle substrates of varying sizes, including round wafers (e.g., semiconductor wafers) such as 150 mm, 200 mm, 300 mm, 450 mm, or the like.

Figure 2:
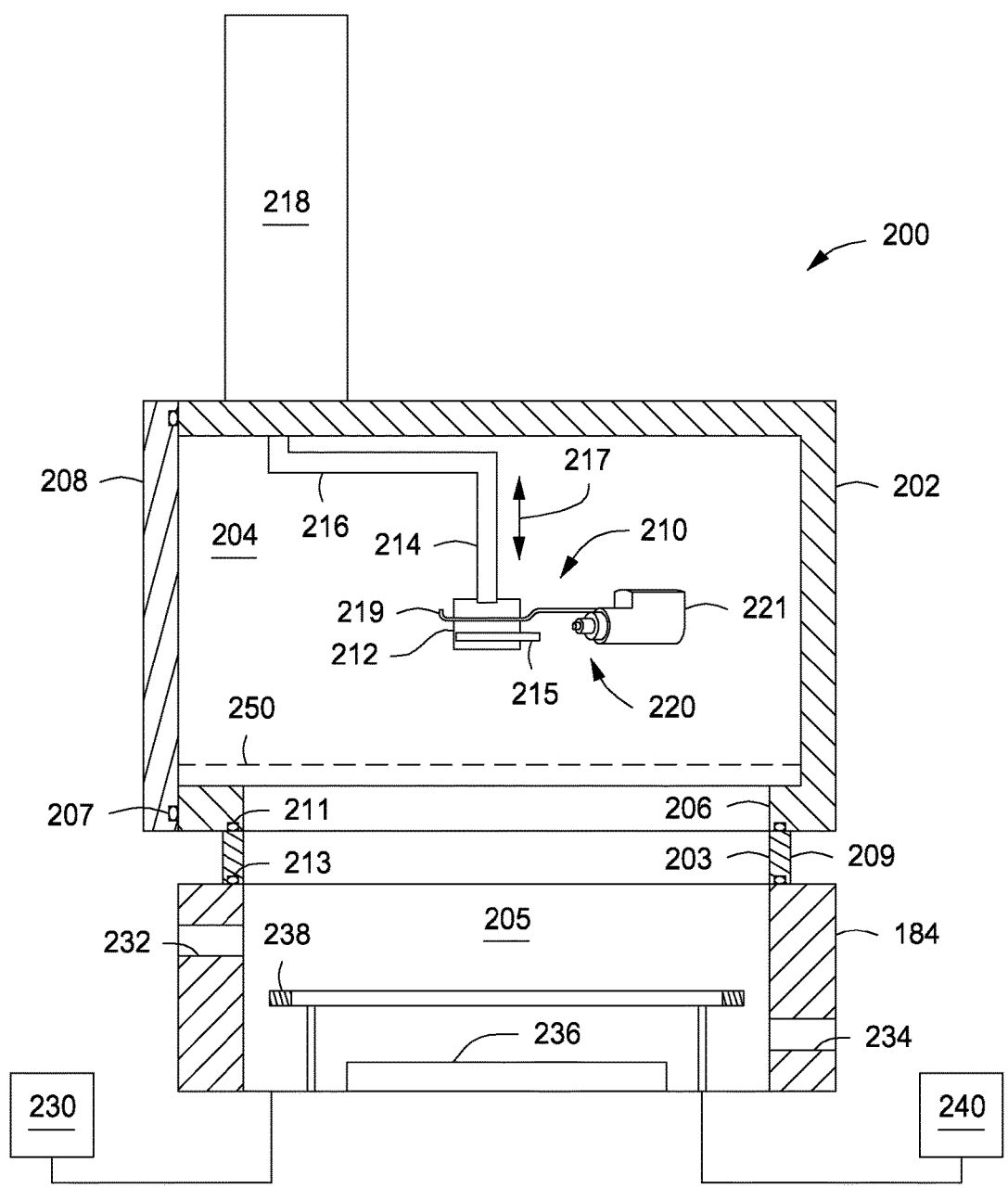
FIG. 2 depicts a cross-sectional view of a substrate transfer apparatus in accordance with some embodiments of the present disclosure.

FIG. 2 depicts a substrate transfer chamber 200 in accordance with some embodiments of the present disclosure. The substrate transfer chamber 200 includes a body 202 that defines an interior volume 204. A bottom portion of the body 202 includes an opening 206 that fluidly couples the interior volume 204 with the load lock chamber 184. The body 202 further includes a door 208 to allow access to the interior volume 204. In order to facilitate coupling of the substrate transfer chamber 200 to the load lock chamber 184, the substrate transfer chamber 200 may include an adapter plate 209 having an opening 203 aligned with the opening 206 to couple the interior volume 204 of the substrate transfer chamber 200 with an inner volume 205 of the load lock chamber 184. The adapter plate 209 will very in dimension and configuration depending upon the structure of the load lock chamber 184 of the specific processing system, which advantageously minimizes the cost of retrofitting the substrate transfer chamber 200 to existing processing systems. The adapter plate 209 may be coupled to the substrate transfer chamber 200 and the load lock chamber 184 using a plurality of fasteners such as, for example, screws (not shown). The adapter plate 209 includes seals 211, 213 (e.g., gaskets, or o-rings) at the interface with the substrate transfer chamber 200 and at the interface with the load lock chamber 184 to ensure a proper seal and avoid any vacuum leaks. Similarly, the door 208 also includes a seal 207 at the interface between the door and the body 202. Because the substrate transfer chamber 200 is fluidly coupled to the load lock chamber 184, a vacuum source 230 that evacuates the load lock chamber 184 also evacuates the substrate transfer chamber 200.

The substrate transfer chamber 200 further includes a cassette support 210 to support a substrate cassette 300 (described below with respect to FIGS. 3 and 4). In some embodiments, the cassette support 210 includes a collar 212 having protrusions 215 that extend from opposite sides of the collar 212 to engage a corresponding mounting apparatus 324 on the substrate cassette 300 and support the substrate cassette 300 in the interior volume 204. However, the cassette support 210 may include any type of device capable of holding onto the substrate cassette 300. The cassette support 210 further includes a shaft 214 coupling the collar 212 to a first end of an arm 216. A lift actuator 218 is coupled to a second end of the arm 216 to raise and lower the cassette support 210 in the direction indicated by arrow 217. The cassette support 210 may include any type of actuator capable of raising and lowering the cassette support 210. In some embodiments, for example, the lift actuator 218 may be a linear actuator. The cassette support 210 further includes a locking device 220, which may be coupled to the cassette support 210 between the collar 212 and the shaft 214. The locking device 220 includes a first piston actuator 221 and a second piston actuator 222 on one side of the collar 212 and a protruding element 219 (e.g., a hook) at an opposite side. The first and second piston actuators 221, 222 are described below together with the locking plate 308 of the substrate cassette 300.

In some embodiments, the substrate transfer chamber 200 may optionally include a seal plate 250 having a shape corresponding to the lower surface of the substrate transfer chamber 200. The seal plate 250 may be placed on the lower surface of the chamber to block the opening 206 to allow the multi-chamber processing system 100 and the load lock chamber 184 to function normally without use of the substrate transfer chamber 200. The seal plate 250 may be secured to the lower surface via any conventional means such as, for example, screws or the like. A seal may be disposed between the seal plate 250 and the lower surface of the substrate transfer chamber 200 to prevent any vacuum leaks during normal operation of the load lock chamber 184.

The load lock chamber 184 includes a first opening 232, a second opening 234, a pedestal 236, and a lift hoop 238. The first opening 232 facilitates interfacing with the docking station 183 to allow the factory interface robot 185 to insert or remove a substrate from the load lock chamber 184. The second opening 234 facilitates interfacing with the processing platform 102 to allow the substrate transfer robot 106 to insert or remove a substrate from the load lock chamber 184. As shown in FIG. 2, the first and second openings 232, 234 may be vertically offset so that the lift hoop is raised to receive/supply a substrate from/to the factory interface robot 185 and lowered to receive/supply a substrate from/to the substrate transfer robot 106. A lift actuator 240 is coupled to the lift hoop 238 to raise or lower the lift hoop 238.

Figure 3:
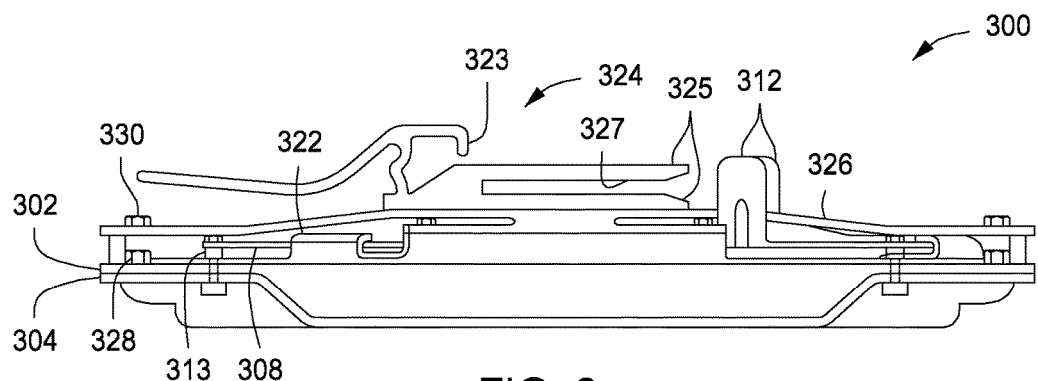
FIG. 3 depicts a side view of a substrate cassette in accordance with some embodiments of the present disclosure.

FIG. 3 depicts a side view a substrate cassette 300 in accordance with some embodiments of the present disclosure. FIG. 4 depicts a top view of the substrate cassette 300 attached to the cassette support 210 of the substrate transfer chamber 200. The substrate cassette 300 includes an upper portion 302 and a lower portion 304 which, when coupled, define an interior volume 505 (shown in FIG. 5). The substrate cassette 300 also includes a locking mechanism 306, which couples the upper portion 302 to the lower portion 304, and a mounting apparatus 324 having prongs 325 and a latch 323. The mounting apparatus 324 is shaped so that the protrusions 215 of the collar 212 are inserted into a space 327 between the prongs 325, which rest on the protrusions 215 to support the substrate cassette 300. As the substrate cassette 300 is moved further into the interior volume 204, the protrusions 215 move further into the space 327 and the latch 323 approaches the protruding element 219. The substrate cassette 300 is pushed until the latch 323 latches onto the protruding element 219, thus locking the substrate cassette 300 in place and allowing the substrate cassette 300 to hang on the cassette support 210.

The locking mechanism 306 may include a locking plate 308 disposed on the upper portion 302 and having a plurality of arms 310 extending from a center of the locking plate 308. Two of the plurality of arms 310 include upwardly extending tabs 312 that are perpendicular to the locking plate 308. A plurality of locking pins 313 extend through ends of the plurality of arms 310 and into a corresponding plurality of slots 314 formed in both the upper portion 302 and the lower portion 304. Each of the plurality of locking pins 313 includes a reduced diameter midsection whose diameter is less than a width of each slot 314 to allow the locking pin 313 to slide along the slot 314. Both ends of each locking pin 313 have a diameter that is greater than a width of the slot 314 to prevent the locking pin 313 from passing through the slot 314. Each of the plurality of slots 314 includes an elongated portion 316 and a hole 318 at one end of the elongated portion 316. A thickness of the elongated portion 316 is less than a diameter of the hole 318.

In a locked position (e.g., when the upper portion 302 and the lower portion 304 are coupled), each locking pin 313 extends through the elongated portion 316. Because the ends of the locking pins 313 are too large to pass through the elongated portion 316, the upper portion 302 and the lower portion 304 are sandwiched together between the enlarged ends. In an unlocked position, each locking pin 313 extends through the hole 318. The ends of the locking pin 313 are sized to allow the locking pin 313 to pass through the holes 318. When each locking pin 313 extends through the hole 318, the upper and lower portions 302, 304 can be separated. To ensure that the locking plate 308 remains coupled to the upper portion 302, each of the plurality of arms 310 includes a protrusion 320 that extends beneath a corresponding tab 322 formed on the upper portion 302. As shown in FIG. 4, the protrusions 320 are substantially perpendicular to the arms 310.

Figure 4:
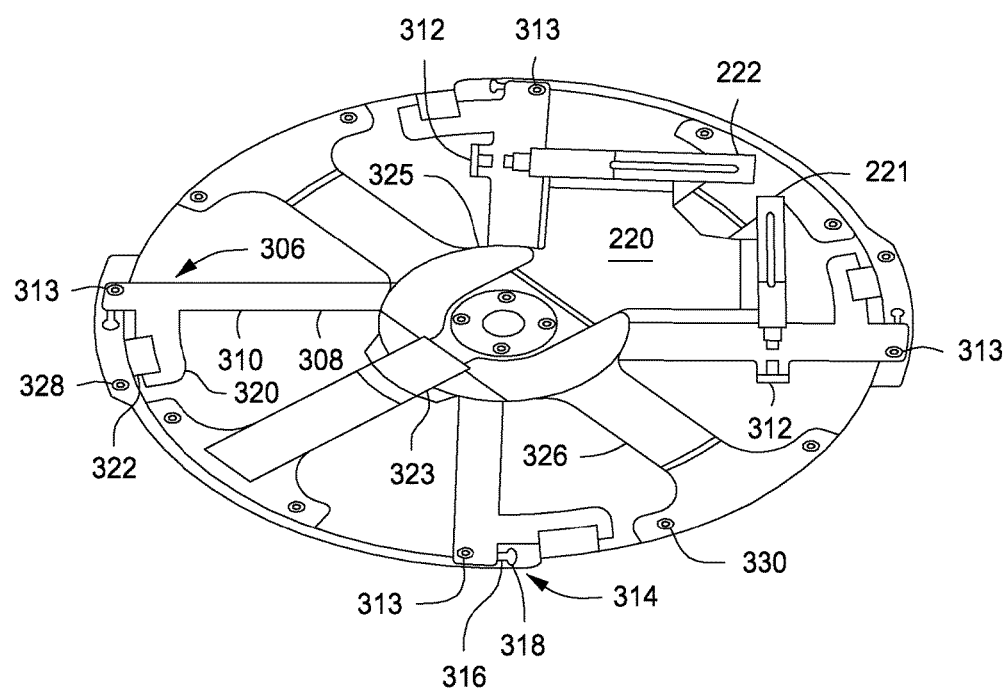
FIG. 4 depicts a top view of a substrate cassette in accordance with some embodiments of the present disclosure.

Referring to FIG. 4, the locking device 220 includes a first piston actuator 221 and a second piston actuator 222 perpendicular to the first piston actuator 221. The first and second piston actuators 221, 222 are each disposed adjacent to one of the upwardly extending tabs 312 to push the upwardly extending tabs 312 and move the locking mechanism 306 in a first direction and a second direction opposite the first direction (e.g., between the locked and unlocked positions). In some embodiments, the first and second piston actuators 221, 222 may be actuated using software.

In some embodiments, the upper portion 302 may include a load distribution plate 326 coupled to an upper surface of the upper portion 302 to evenly distribute a downwardly projecting force by the cassette support 210 pressing the upper portion 302 against the lower portion 304 for coupling. The load distribution plate 326 is coupled to the upper portion 302 via a plurality of fastening elements 330 (e.g., bolts, screws, or the like). In some embodiments, the upper portion 302 may further include a plurality of locating pins 328 to interface with a corresponding plurality of holes in the lower portion 304 to correctly align the upper and lower portions 302, 304 during coupling.

Figure 5:
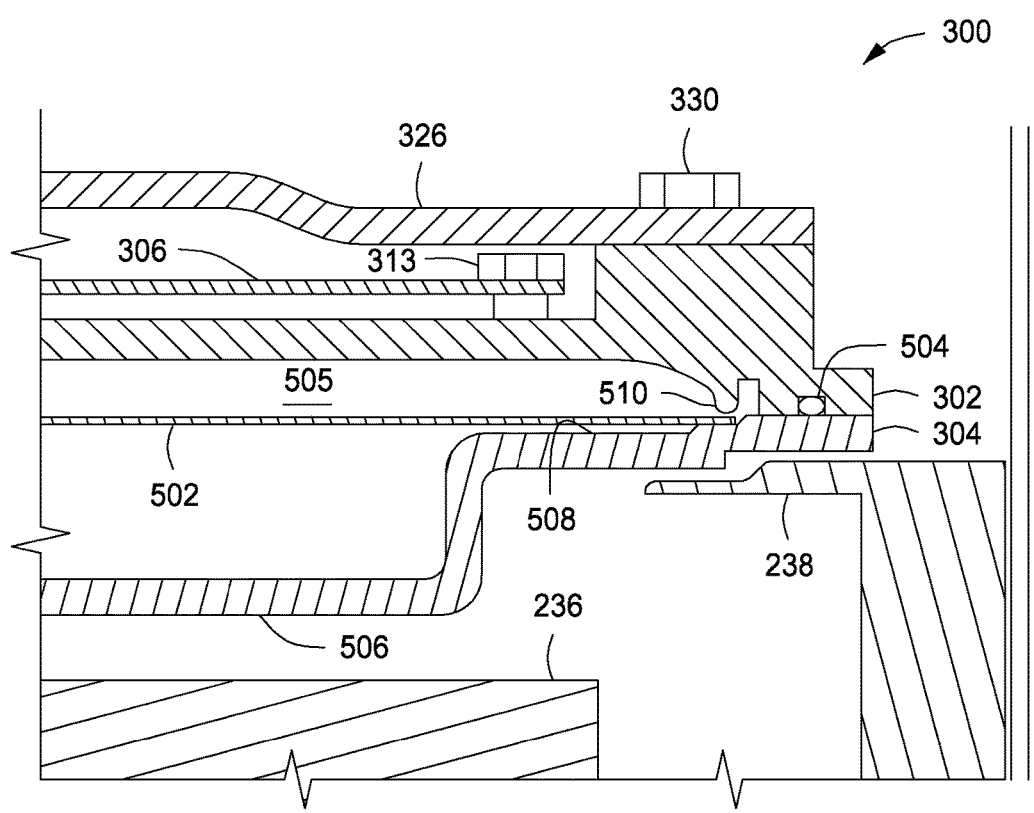
FIG. 5 depicts a cross-sectional close up view of a substrate cassette in accordance with some embodiments of the present disclosure.

FIG. 5 depicts a close up cross-sectional view of the substrate cassette 300 containing a substrate 502. The substrate 502 rests on an inner surface 508 of the lower portion 304. In some embodiments, the inner surface may be shaped so that the number of contact points between the substrate 502 and the inner surface 508 is minimal to prevent any damage to a backside of the substrate 502. For example, the number of contact points may be limited to four contact points. In, some embodiments, the upper portion 302 may include an annular ring 510 proximate a periphery of the substrate 502 to limit or substantially eliminate any movement of the substrate 502 during transport. The upper and lower portions 302, 304 may be formed of any material that will not damage the substrate 502. For example, in some embodiments the upper and lower portions 302, 304 are formed of polyether ether ketone (PEEK). The lower portion 304 may include a seal 504 (e.g., gasket, o-ring, or the like) around a periphery of the lower portion at the interface between the lower portion 304 and the upper portion 302. The seal 504 prevents any vacuum leaks when the substrate cassette 300 is removed from the vacuum environment inside of the substrate transfer chamber 200. The seal 504 is formed of a material that is non-sticky, vacuum-compatible material to ensure that the separation of the upper and lower portions 302, 304 does not damage the seal 504.

As shown in FIG. 5, the lower portion 304 includes a recessed section 506 through which the substrate transfer robot 106 can extend to lift the substrate 502 after the upper portion 302 has been separated from the lower portion 304.

In operation, the substrate cassette 300 is inserted onto the collar 212 of the substrate transfer chamber 200. When the door 208 is closed, the vacuum source 230 coupled to the load lock chamber 184 evacuates the interior volume 204 and the inner volume 205. The lift actuator 218 then lowers the substrate cassette 300 onto one of the lift hoop 238 (if the lift hoop 238 is raised) or the pedestal 236 (if the lift hoop 238 is lowered). If the substrate cassette 300 is lowered onto the raised lift hoop 238, the lift hoop 238 is lowered until the substrate cassette 300 rests on the pedestal 236. The locking device 220 is subsequently activated to rotate the locking mechanism 306 towards the unlocked position. Next, the lift actuator 218 lifts the upper portion 302 up, leaving the lower portion 304 resting on the pedestal 236. A substrate 502 is either placed in or removed from the substrate cassette 300. Subsequently, the lift actuator 218 lowers the upper portion 302 onto the lower portion 304 and forces the two portions together. The load distribution plate 326 ensures that the force is evenly distributed about the substrate cassette 300. The locking device 220 then rotates the locking mechanism towards the locked position, thus locking the upper and lower portions 302, 304 together. After the interior volume 204 and the inner volume 205 return to atmosphere, the lift actuator 218 lifts the substrate cassette 300 back up into the substrate transfer chamber 200 for removal.

Figure 6:
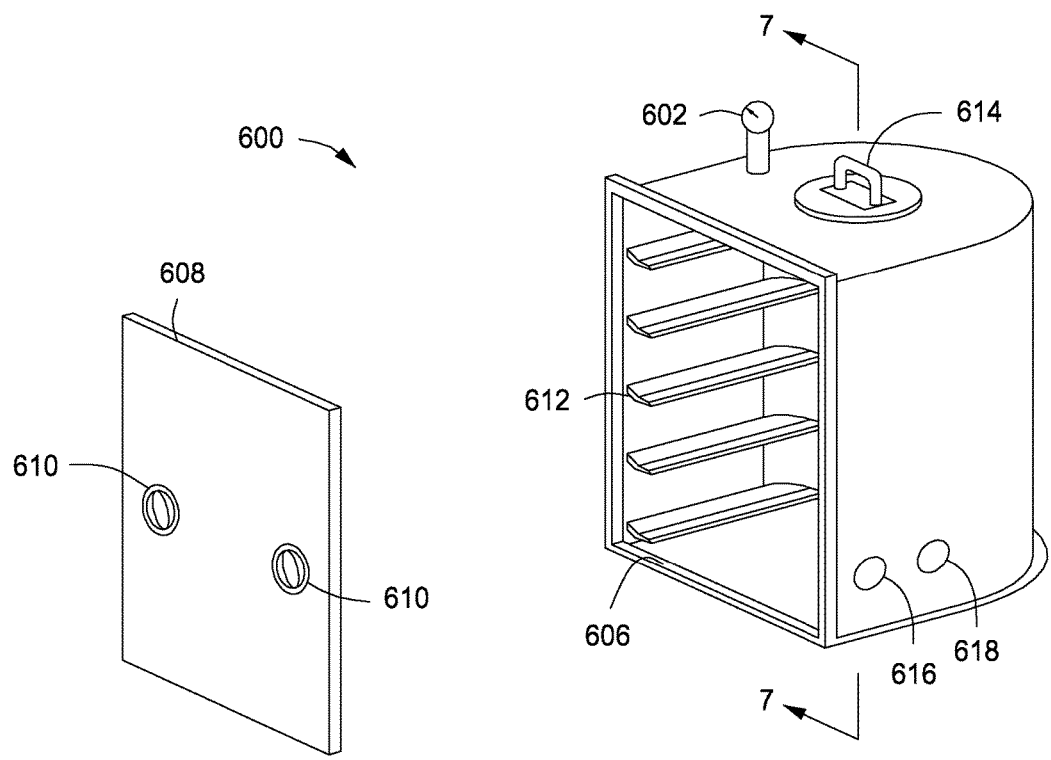
FIG. 6 depicts an isometric view of a multi-cassette carrying case in accordance with some embodiments of the present disclosure.
Figure 7:
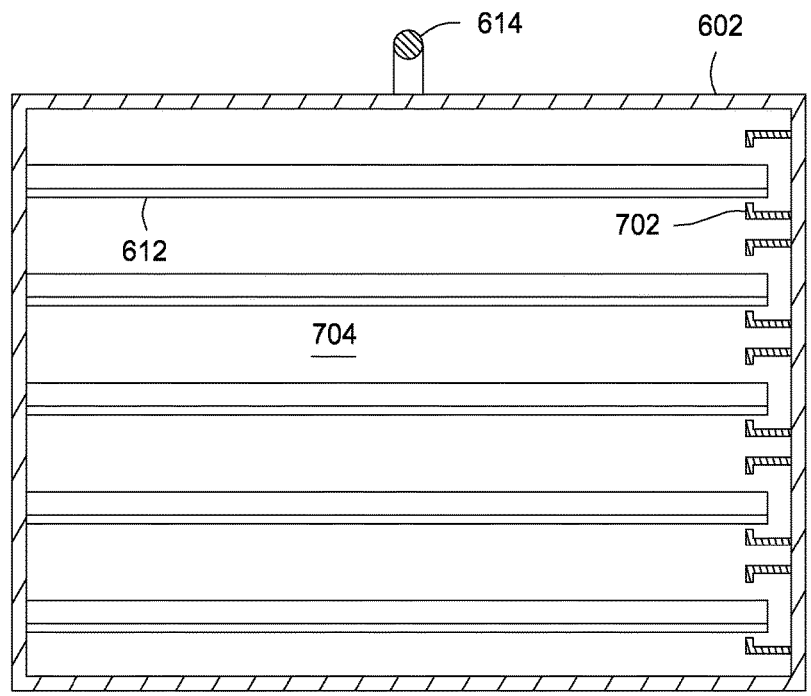
FIG. 7 depicts a cross-section view of the multi-cassette carrying case of FIG. 6.

FIGS. 6 and 7 depict a multi-cassette carrying case 600 in accordance with some embodiments of the present disclosure. The multi-cassette carrying case 600 includes a body 602 that defines an inner volume 704 and has an opening 606. At least one handle 614 may be disposed on an outer surface of the body 602 to enable carrying of the multi-cassette carrying case 600. The multi-cassette carrying case 600 further includes a door 608 that is placed in the opening 606 to seal off the inner volume 704. Although in FIG. 6 the door 608 is shown as fully detachable, the door 608 may alternatively be attached to a side of the body 602 via a hinge assembly. The door 608 includes locking mechanisms 610 that facilitate locking the door 608 in the opening 606. The locking mechanisms 610 may include any locking mechanisms suitable to fix the door 608 shut.

The multi-cassette carrying case 600 further includes a plurality of cassette holders to hold one or more substrate cassettes 300. The cassette holders include a plurality of ledges 612 on opposite sides of the inner volume 704 to support one or more substrate cassettes 300. To ensure that the substrate cassettes 300 do not move during transport, the plurality of cassette holders may further include a plurality of snap locks 702 disposed at a rear portion of the inner volume 704. To place a substrate cassette 300 in the multi-cassette carrying case 600, the substrate cassette 300 is placed on a set of ledges 612 and pushed towards the corresponding snap lock 702. When the substrate cassette 300 contacts the snap lock 702, the substrate cassette 300 is pushed further so that the snap lock 702 deforms outwardly and subsequently latches onto the substrate cassette 300, thus locking the substrate cassette 300 in place.

In some embodiments, the multi-cassette carrying case 600 may include a vacuum port 616 and a vent port 618 to allow coupling of the multi-cassette carrying case to a vacuum source. In embodiments in which the inner volume 704 of the multi-cassette carrying case 600 is evacuated, the door 608 may include a seal around the periphery of the door to prevent any vacuum leaks during transport. In some embodiments, the multi-cassette carrying case 600 may also include a pressure monitoring device 620 to monitor and display a pressure of the inner volume 704. Alternatively or in combination, the vacuum port 616, vent port 618, or another port (not shown), may be coupled to a gas source, for example an inert gas source, to provide an inert gas to the interior of the multi-cassette carrying case.

Figure 8:
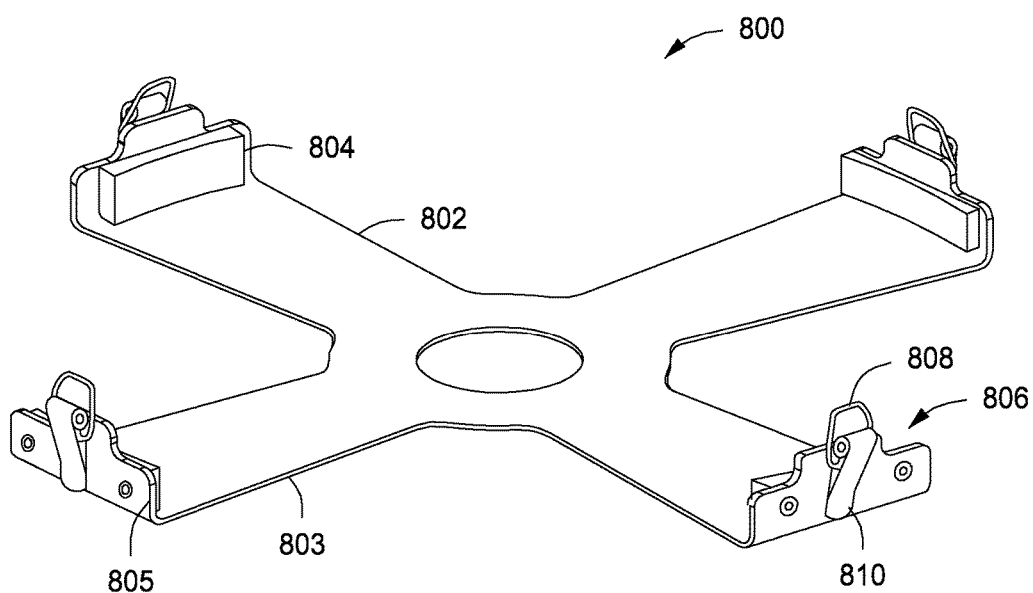
FIG. 8 depicts an isometric view of a cassette protector for use with the substrate cassette carrying apparatus of FIG. 6 in accordance with some embodiments of the present disclosure.
Figure 9:
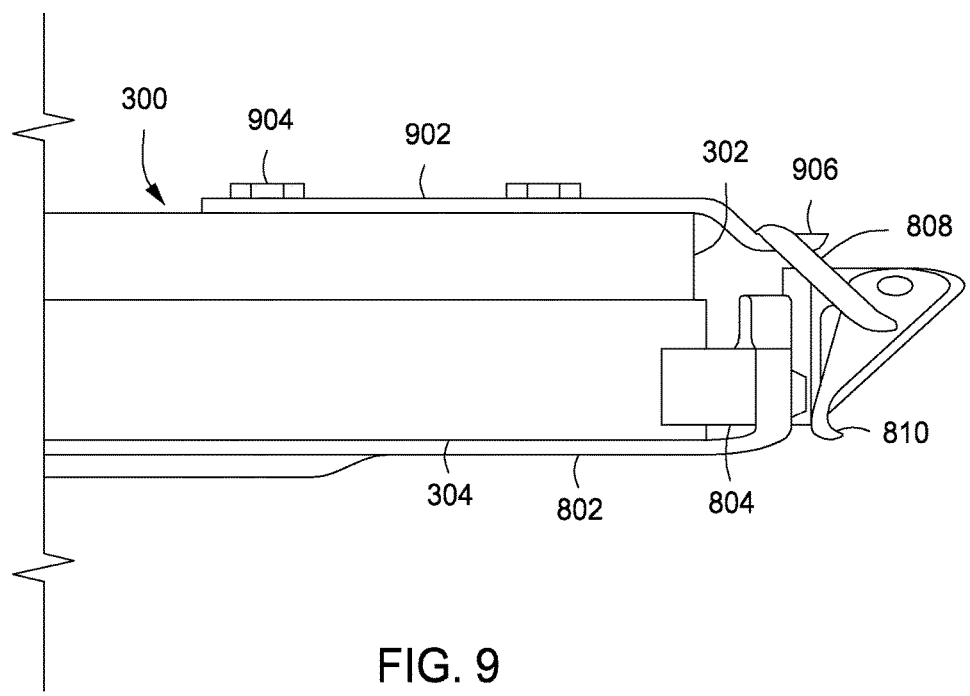
FIG. 9 depicts a close-up view of the cassette protector of FIG. 8.

FIGS. 8 and 9 depict a cassette protector 800 in accordance with some embodiments of the disclosure. In some embodiments, the cassette protector 800 may be used in combination with the multi-cassette carrying case 600 to provide added protection to the substrate cassette 300. The cassette protector 800 includes a plate 802 having a plurality of arms 803. Each of the plurality of arms 803 includes an upwardly projecting edge 805. A plurality of bumpers 804 are respectively disposed on inner surfaces of the upwardly projecting edges 805. The distance from a first bumper 804 to a second bumper 804 disposed across from the first bumper 804 is approximately equal to a diameter of the substrate cassette 300. Each of the projecting edges 805 includes a latching apparatus 806 having a latch 808 and a latch handle 810 to secure the cassette protector to a substrate cassette.

Referring to FIG. 9, a plurality of latch plates 902 corresponding to the plurality of arms 803 are coupled to the upper portion 302 of the substrate cassette 300 via fixation elements 904. The latch plate 902 includes a hook 906 which, when the substrate cassette 300 is placed in the cassette protector 800, is disposed adjacent the latch 808. To engage the latch 808, the latch handle 810 is lifted, the latch 808 is placed on the hook 906, and the latch handle 810 is pushed down again, thus coupling the cassette protector 800 to the substrate cassette 300.

Figure 10:
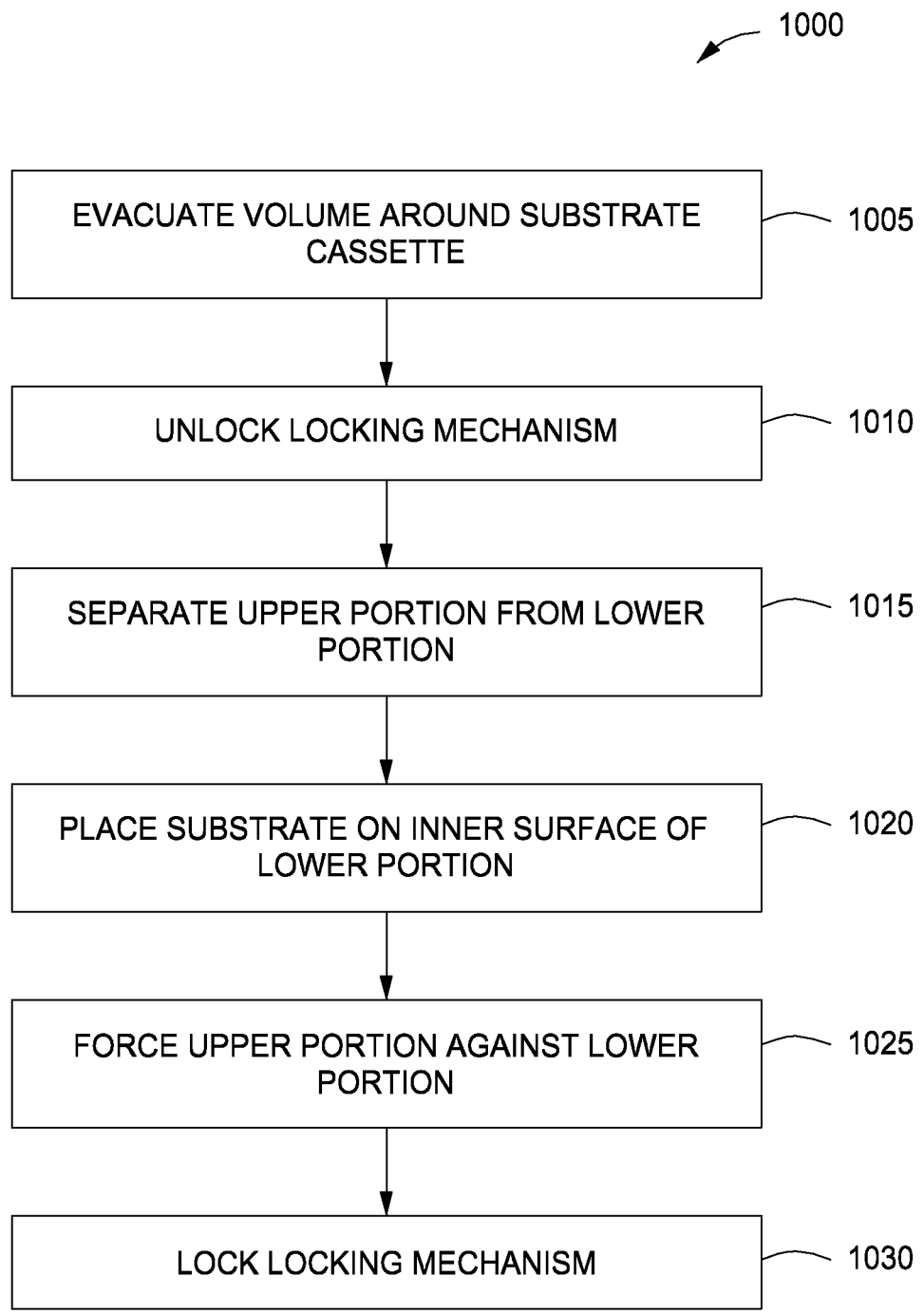
FIG. 10 is a flowchart illustrating a method of loading a substrate to be processed into a substrate cassette in accordance with some embodiments of the present disclosure.

FIG. 10 is a flowchart illustrating a method 1000 of loading a substrate 502 to be processed into a substrate cassette 300 in accordance with some embodiments of the present disclosure. At 1005, a volume (interior volume 204) in which the substrate cassette 300 is disposed is evacuated. At 1010, a locking mechanism 306 of the substrate cassette 300 is unlocked to uncouple an upper portion 302 from a lower portion 304 of the substrate cassette 300. At 1015, the upper portion 302 is separated from the lower portion 304. At 1020, the substrate 502 is placed on an inner surface 508 of the lower portion 304. At 1025, the upper portion 302 is forced against the lower portion 304. At 1030, the locking mechanism 306 is locked to couple the upper portion 302 to the lower portion 304. Thus, the substrate may be disposed in the substrate cassette 300 in a vacuum environment while located outside of the vacuum processing tool.

Returning to FIG. 1, the controller 140 may be provided and coupled to various components of the multi-chamber processing system 100 to control the operation of the multi-chamber processing system 100. The controller 140 includes a central processing unit (CPU) 142, a memory 144, and support circuits 146. The controller 140 may control the multi-chamber processing system 100 directly, or via computers (or controllers) associated with particular process chamber and/or support system components. The controller 140 may be any form of general-purpose computer processor that can be used in an industrial setting for controlling various chambers and sub-processors. The memory, or computer readable medium, 144 of the controller 140 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 146 are coupled to the CPU 142 for supporting the processor in a conventional manner. These circuits include cache, power supplies, clock circuits, input/output circuitry and subsystems, and the like. Inventive methods as described herein, such as the method 1000, may be stored in the memory 144 as software routine that may be executed or invoked to control the operation of the multi-chamber processing system 100 in the manner described herein. The software routine may also be stored and/or executed by a second CPU (not shown) that is remotely located from the hardware being controlled by the CPU 142.

While the foregoing is directed to embodiments of the present disclosure, other and further embodiments of the disclosure may be devised without departing from the basic scope thereof.

The invention claimed is:

1. A substrate cassette; comprising:
   a body having an upper portion and a lower portion, the upper portion and the lower portion defining an interior volume when the upper portion is coupled to the lower portion;
   a locking mechanism moveable between a locked position, in which the upper and lower portions are coupled, and an unlocked position, in which the lower portion can be separated from the upper portion; and
   a load distribution plate coupled to an upper surface of the upper portion along an edge of the upper portion to distribute a load applied to the load distribution plate.

2. The substrate cassette of claim 1, wherein the upper portion and the lower portion include a plurality of slots.

3. The substrate cassette of claim 2, wherein each of the plurality of slots has an elongated portion and a hole at an end of the elongated portion, wherein a thickness of the elongated portion is less than a diameter of the hole.

4. The substrate cassette of claim 3, wherein the locking mechanism comprises:
   a locking plate having a plurality of arms;
   a plurality of locking pins, each of which is coupled to an end of a corresponding one of the plurality of arms; and
   a plurality of protrusions, each of which extends from a corresponding one of the plurality of arms,
   wherein each of the plurality of locking pins extends through the elongated portion in the locked position, and
   wherein each of the plurality of locking pins extend through the hole in the unlocked position, and
   wherein each of the plurality of protrusions extends beneath a corresponding tab formed in the upper portion.

5. The substrate cassette of claim 4, wherein each of the plurality of locking pins includes a midsection having a reduced diameter to allow each of the plurality of locking pins to slide along the elongated portion.

6. The substrate cassette of claim 5, wherein the body is held between ends of the plurality of locking pins to couple the upper portion to the lower portion.

7. The substrate cassette of claim 6, wherein the ends of the locking pins are sized to prevent the plurality of locking pins from passing through the elongated portions of the plurality of slots when the upper portion is coupled to the lower portion, and to allow the plurality of locking pins to pass through the holes of the plurality of slots to uncouple the lower portion from the upper portion.

8. The substrate cassette of claim 7, wherein the locking mechanism further comprises:
   a first tab configured to be engaged by a first actuator to move the locking mechanism in a first direction towards the unlocked position; and
   a second tab configured to be engaged by a second actuator to move the locking mechanism in a second direction towards the locked position.

9. The substrate cassette of claim 1, further comprising:
   a seal disposed around a periphery of the lower portion to prevent a vacuum leak when the upper portion is coupled to the lower portion.

10. The substrate cassette of claim 1, further comprising:
    a mounting apparatus configured to allow the substrate cassette to hang from a cassette support in a substrate transfer chamber.

11. The substrate cassette of claim 1, wherein the lower portion includes a recessed section to allow a substrate transfer robot to pass through and lift a substrate disposed on an inner surface of the lower portion.

12. The substrate cassette of claim 1, wherein the upper portion and the lower portion are formed of PEEK.

13. A substrate cassette; comprising:
    a body having an upper portion and a lower portion, the upper portion and the lower portion having a plurality of slots and defining an interior volume when the upper portion is coupled to the lower portion, wherein the upper portion includes a plurality of tabs disposed on an upper surface of the upper portion, and wherein each of the plurality of slots has an elongated portion and a hole at an end of the elongated portion;
    a locking plate having a plurality of arms moveable between a locked position, in which the upper and lower portions are coupled, and an unlocked position, in which the lower portion can be separated from the upper portion;
    a plurality of locking pins, each of which is coupled to an end of a corresponding one of the plurality of arms;
    a plurality of protrusions, each of which extends from a corresponding one of the plurality of arms; and
    a load distribution plate coupled to an upper surface of the upper portion along an edge of the upper portion to distribute a load applied to the load distribution plate,
    wherein each of the plurality of locking pins extends through the elongated portion in the locked position,
    wherein each of the plurality of locking pins extend through the hole in the unlocked position, and
    wherein each of the plurality of protrusions extends beneath a corresponding one of the plurality of tabs.

14. The substrate cassette of claim 13, wherein each of the plurality of locking pins includes a midsection having a reduced diameter to allow each of the plurality of locking pins to slide along the elongated portion.

15. The substrate cassette of claim 14, wherein the body is held between ends of the plurality of locking pins to couple the upper portion to the lower portion.

16. The substrate cassette of claim 15, wherein the ends of the locking pins are sized to prevent the plurality of locking pins from passing through the elongated portions of the plurality of slots when the upper portion is coupled to the lower portion, and to allow the plurality of locking pins to pass through the holes of the plurality of slots to uncouple the lower portion from the upper portion.

17. The substrate cassette of claim 16, wherein the locking plate further comprises:
    a first tab to allow the locking plate to be moved in a first direction towards the unlocked position; and
    a second tab to allow the locking plate to be moved in a second direction towards the locked position.

18. The substrate cassette of claim 13, further comprising:
a seal disposed around a periphery of the lower portion to prevent a vacuum leak when the upper portion is coupled to the lower portion.

19. The substrate cassette of claim 13, wherein the lower portion includes a recessed section to allow a substrate transfer robot to pass through and lift a substrate disposed on an inner surface of the lower portion.

* * * * *